United States Patent
Boylan et al.

(10) Patent No.: US 6,249,447 B1
(45) Date of Patent: Jun. 19, 2001

(54) SYSTEM AND METHOD FOR DETERMINING OUTPUT CURRENT AND CONVERTER EMPLOYING THE SAME

(75) Inventors: Jeffrey J. Boylan; Mark E. Jacobs, both of Dallas; Allen F. Rozman, Richardson, all of TX (US)

(73) Assignee: Tyco Electronics Logistics AG, Steinach/SG (CH)

( * ) Notice: Subject to any disclaimer, the term of this patent is extended or adjusted under 35 U.S.C. 154(b) by 0 days.

(21) Appl. No.: 09/374,217

(22) Filed: Aug. 13, 1999

(51) Int. Cl.[7] ......................... H02M 3/335; H02M 7/44; H02M 7/537
(52) U.S. Cl. ........................... 363/97; 363/131; 363/21
(58) Field of Search ............................ 363/20, 21, 95, 363/97, 131; 323/286, 287

(56) References Cited

U.S. PATENT DOCUMENTS

| | | | |
|---|---|---|---|
| 5,731,694 | * 3/1998 | Wilcox et al. | 323/287 |
| 5,747,976 | * 5/1998 | Wong et al. | 323/282 |
| 5,877,611 |   3/1999 | Brkovic | 323/222 |
| 5,982,160 | * 11/1999 | Walters et al. | 323/282 |
| 5,991,171 | * 11/1999 | Cheng | 363/97 |
| 5,991,172 | * 11/1999 | Jovanovic et al. | 363/97 |
| 6,009,000 | * 12/1999 | Siri | 363/65 |

OTHER PUBLICATIONS

"High Power Density, High Efficiency and Fast Transient Voltage Regulator Module with a Novel Current Sensing and Current Sharing Technique" by Xunwei Zhou, Xu Peng and Fred C. Lee; Mar. 14, 1999; APEC 99; pp. 289–294.

"Near–Optimum Dynamic Regulation of DC–DC Converters Using Feed–Forward of Output Current and Input Voltage with Current–Mode Control" by Richard Redl and Nathan O. Sokal; IEEE 1986; pp. 181–192.

"Near–Optimum Dynamic Performance of Switching––Mode Power Converters Using Feed–Forward of Output Current and Input Voltage with Current–Mode Control" from the Fourth ESTEC Spacecraft Power–Conditioning Seminar in Sep. 1982; pp. 33–42.

* cited by examiner

Primary Examiner—Peter S. Wong
Assistant Examiner—Bao Q. Vu

(57) ABSTRACT

A system and method for determining an output current of a power converter having an output capacitor and a component coupled thereto. In one embodiment, the system includes (1) an observer circuit, parallel-coupled to the output capacitor, that senses a voltage across the output capacitor and develops therefrom a capacitor signal representing a current through the output capacitor, (2) a sensor circuit, coupled to the component, that senses a characteristic of the component and develops therefrom a component signal representing a current through the component and (3) a summer circuit, coupled to the observer and sensor circuits, that derives an output signal representing the output current from the capacitor signal and the component signal.

25 Claims, 6 Drawing Sheets

SYSTEM AND METHOD FOR DETERMINING OUTPUT CURRENT AND CONVERTER EMPLOYING THE SAME

CROSS-REFERENCE TO RELATED PATENT

This application is related to U.S. Pat. No. 5,877,611 entitled "Simple and Efficient Switching Regulator for Fast Transient Loads such as Microprocessors" issued to Brkovic on Mar. 2, 1999. The above-listed patent is incorporated herein by reference as if reproduced herein in its entirety.

TECHNICAL FIELD OF THE INVENTION

The present invention is directed, in general, to power conversion and, more specifically, to a system and method for indirectly determining an output current of a power converter and a power converter employing the system or the method.

BACKGROUND OF THE INVENTION

A power converter is a power processing circuit that converts an input voltage waveform into a specified output voltage waveform. In many applications requiring a DC output, switched-mode DC—DC converters are frequently employed to advantage. DC—DC converters generally include an inverter, a primary winding of a transformer coupled to the inverter, a rectifier coupled to a secondary winding of the transformer, and an output filter. The inverter generally includes a power switch, such as a field-effect transistor (FET), that converts the DC input voltage to an AC voltage. The transformer then transforms the AC voltage to another value and the rectifier generates the desired DC voltage at the output of the converter. The output filter, typically an output inductor and an output capacitor, smooths and filters the output voltage for delivery to a load.

There are two preferable methods for regulating the output voltage of the converter, namely, voltage-mode control and current-mode control. In voltage-mode control, the output voltage of the converter is fed back through a compensated error amplifier to produce a threshold voltage. A comparator then generates a drive signal for the power switch as a function of the threshold voltage (e.g., the comparator may turn on the power switch when the threshold voltage exceeds a periodic ramp signal). In current-mode control, a current in the converter, such as a switch current or an inductor current, is substituted for, or added to, the periodic ramp signal. The output voltage of the converter is also fed back through the compensated error amplifier to provide the threshold voltage for the comparator. The aforementioned methods and variations thereof are widely used and are adequate for many loads.

Low voltage digital loads that generate wide bandwidth step changes in output current, however, may cause the converter to produce unacceptable transient output voltages. The variations in the output voltage are caused, in part, by the output inductor. While the output filter advantageously attenuates output ripple current resulting from the switching action of the converter, the output inductor impedes rapid changes in the output current of the converter. Designers have attempted to reduce the effects of the output inductor by increasing a bandwidth of the control loop or by decreasing the size of the output inductor. The bandwidth of the control loop, however, is limited because the control loop may not be able to reliably compensate for the interactions between the various reactive elements in the converter at high frequencies. The limited bandwidth of common control elements, such as operational amplifiers and optical isolators, as well as the need to preserve noise immunity in the control process, impose additional limitations. In general, it may be difficult to operate the control loop at a frequency greater than 10–15% of the switching frequency of the converter using readily available sensory and control elements. Reducing the size of the output inductor may also be of limited value, since any reduction in the size of output inductor may increase the ripple current in the output capacitor, resulting in increased output ripple voltage.

Since the output voltage of the converter should ideally be regulated to a substantially constant value, it is important that the output impedance of the converter be kept as low as possible to reduce any effect on the output voltage caused by changes in the output current. Further, the output impedance should be minimized to meet the output ripple voltage requirements, which may be less than 1% of the output voltage. The output impedance of the converter is generally a function of frequency components in the output current. When a substantial portion of the frequency components are well below the bandwidth of the converter control loop, a high-gain control loop may be able to adequately compensate for changes in the output current, resulting in a very low output impedance. As a substantial portion of the frequency components approach or exceed the bandwidth of the converter control loop, however, the control loop may become ineffective in compensating for the fast output current changes. The output impedance of the converter may be principally determined, at high frequencies, by the characteristics of the passive components of the output filter, such as the output capacitor. As frequency increases, the impedance of the output capacitor decreases until an equivalent series resistance or a reactance (due to the parasitic inductance) of the output capacitor becomes larger than the reactance of the output capacitor itself. The parasitic properties of the interconnecting wiring paths that couple the output capacitor to the circuit are typically included in determining the parasitic properties of the output capacitor. Thus, the interconnecting wiring path between the output capacitor and the load should be as short as possible to minimize the parasitic inductance of the output capacitor, thereby minimizing the output impedance of the converter.

A common solution to the aforementioned problem has been to add substantial amounts of capacitance at the output of the converter and at the load, thereby decreasing the output impedance of the converter. The additional capacitance, however, will increase both the size and cost of the converter. Another way to reduce the effects of fast transients in a converter is to interleave a number of power trains togther. Interleaved power trains may accommodate smaller output inductors without substantial increases in the total output ripple current. Multiple power trains, however, may significantly increase the complexity and cost of the converter.

Yet another way to reduce the effects of the transients at the output of the converter is to employ output current feedforward. For a discussion of conventional output current feedforward techniques for converters with current-mode control, see *Near-Optimum Dynamic Regulation of DC—DC Converters using Feed-Forward of Output Current and Input Voltage with Current-Mode Control, IEEE Transactions on Power Electronics*, by Richard Redl and Nathan Sokal, pp. 181–192, Vol. PE-1, No. 3, July 1986, which is herein incorporated by reference.

Output current feedforward techniques require that the output current of the converter be sensed. Circuit elements introduced into the converter circuitry to sense the output current, however, typically have an adverse effect on the output impedance of the converter, especially at high frequencies. In the aforementioned article, Redl and Sokal describe the use of a small current sensing transformer in series with the output capacitor to sense the current through the output capacitor. While the current sensing transformer may be effective in many applications, the introduction of any series element in the output circuit of the converter(on the load side of the output capacitors) may adversely affect the output impedance of the converter, especially at high frequencies. Converters using the approach described by Redl and Sokal, therefore, cannot be readily employed in many applications, particularly applications wherein the loads experience wide bandwidth current changes. Further, board space for the converter may be limited, requiring the current sensing transformer to be placed on the end user's board, presenting further obstacles.

Accordingly, what is needed in the art is a system and method that determines the output current of a power converter that overcomes the deficiencies of the prior art.

SUMMARY OF THE INVENTION

To address the above-discussed deficiencies of the prior art, the present invention provides, for use with a power converter having an output capacitor and a component coupled thereto, a system and method for determining an output current of the power converter and a power converter employing the system or the method. In one embodiment, the system includes (1) an observer circuit, parallel-coupled to the output capacitor, that senses a voltage across the output capacitor and develops therefrom a capacitor signal representing a current through the output capacitor, (2) a sensor circuit, coupled to the component, that senses a characteristic of the component and develops therefrom a component signal representing a current through the component and (3) a summer circuit, coupled to the observer and sensor circuits, that derives an output signal representing the output current from the capacitor signal and the component signal.

The present invention introduces, in one aspect, the broad concept of indirectly measuring the output current of the power converter. The present invention recognizes that the output current of the power converter may be determined as a function of the current through the component and the current through the output capacitor. For instance, in one embodiment, the output current may be determined by subtracting the component signal from the capacitor signal.

The present invention advantageously employs an observer circuit to indirectly measure the current through the output capacitor. In one embodiment, the observer circuit may be a series-coupled capacitor and resistor. The voltage across the output capacitor may be determined by measuring a voltage across the resistor. In an alternative embodiment, the observer circuit may be a series-coupled resistor and inductor. The voltage across the output capacitor may be determined by measuring a voltage across the inductor. In either case, the observer circuit indirectly senses the voltage across the output capacitor and develops therefrom the capacitor signal representing the current through the output capacitor. Indirect measurement of the current in the output capacitor may be important in applications that experience wide bandwidth step changes in the output current. In such applications, coupling a circuit element in series with the output capacitor may introduce an extraneous circuit impedance that may compromise the high frequency transient response of the power converter.

The present invention also employs a sensor circuit that senses a characteristic of the component and develops therefrom the component signal. In one embodiment, the sensor circuit is an observer circuit that indirectly measures the current through the component. In a related embodiment, the sensor circuit may be coupled across the component. Of course, the sensor circuit need not be coupled across the component. In another related embodiment of the present invention, the sensor circuit is selected from the group consisting of (1) a series-coupled capacitor and resistor and (2) a series-coupled resistor and inductor. The sensor circuit indirectly senses the characteristic (e.g., a voltage across the component) by measuring a voltage across the resistor or inductor, respectively, and develops therefrom the component signal.

In one embodiment of the present invention, the sensor circuit is series-coupled to the component. In a related embodiment, the sensor circuit includes an element selected from the group consisting of a resistor and a current-sensing transformer. In such embodiments, the sensor circuit may directly measure the current through the component by employing the element. Thus, the sensor circuit is adapted to sense a characteristic of the component and directly or indirectly derive therefrom the component signal.

In one embodiment of the present invention, the component is an inductor. The component may be an output inductor, cooperating with the output capacitor to form an output filter. In an alternative embodiment (e.g., a flyback topology), the component may be a diode. Of course, the component may be any other component, conventional or later-developed, through which a portion of the output current flows.

In one embodiment of the present invention, the system further includes a scaling circuit that adjusts a gain of the capacitor signal relative to the component signal. A scaling factor (e.g., amperes/volt) of the adjusted capacitor signal may thus be substantially equivalent to a scaling factor of the component signal. Those skilled in the art are familiar with scaling circuits and their operation. Of course, the scaling circuit is not necessary to the present invention.

In one embodiment of the present invention, the system further includes a filter circuit that limits a bandwidth of the output signal. The filter circuit may thus frequency shape the output signal to control noise. In a related embodiment, the filter circuit may also adjust a gain of the output signal as required. Those skilled in the art are familiar with filter circuits and their operation. Of course, the filter circuit is not necessary to the present invention.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art will appreciate that they can readily use the disclosed conception and specific embodiment as a basis for designing or modifying other structures for carrying out the same purposes of the present invention. Those skilled in the art will also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

The output voltage of a power converter should ideally be regulated to a substantially constant value without regard to changes in a load current $I_{LOAD}$ provided by the power converter. In an exemplary power converter having an output inductor with an inductance L coupled to an output capacitor with a capacitance C, a constant output voltage indicates that a voltage across the output capacitor is constant and that a current through the output capacitor is substantially zero. A current $I_L$ through the output inductor should thus be substantially equal to the load current $I_{LOAD}$. A voltage $V_L$ across the output inductor L may be approximated (ignoring the effects of parasitic elements) by the following equation:

$$V_L = L\frac{dI_L}{dt} + I_L R_L$$

wherein $R_L$ is an equivalent resistance of the output inductor.

Inversely, applying the voltage $V_L$ to the output inductor will develop a current $I_L$ therethrough that is substantially equal to the output current $I_{LOAD}$. The current through the output capacitor may thus be substantially zero, resulting in a constant voltage across the output capacitor and, therefore, a constant output voltage at the output of the power converter.

Figure 1:
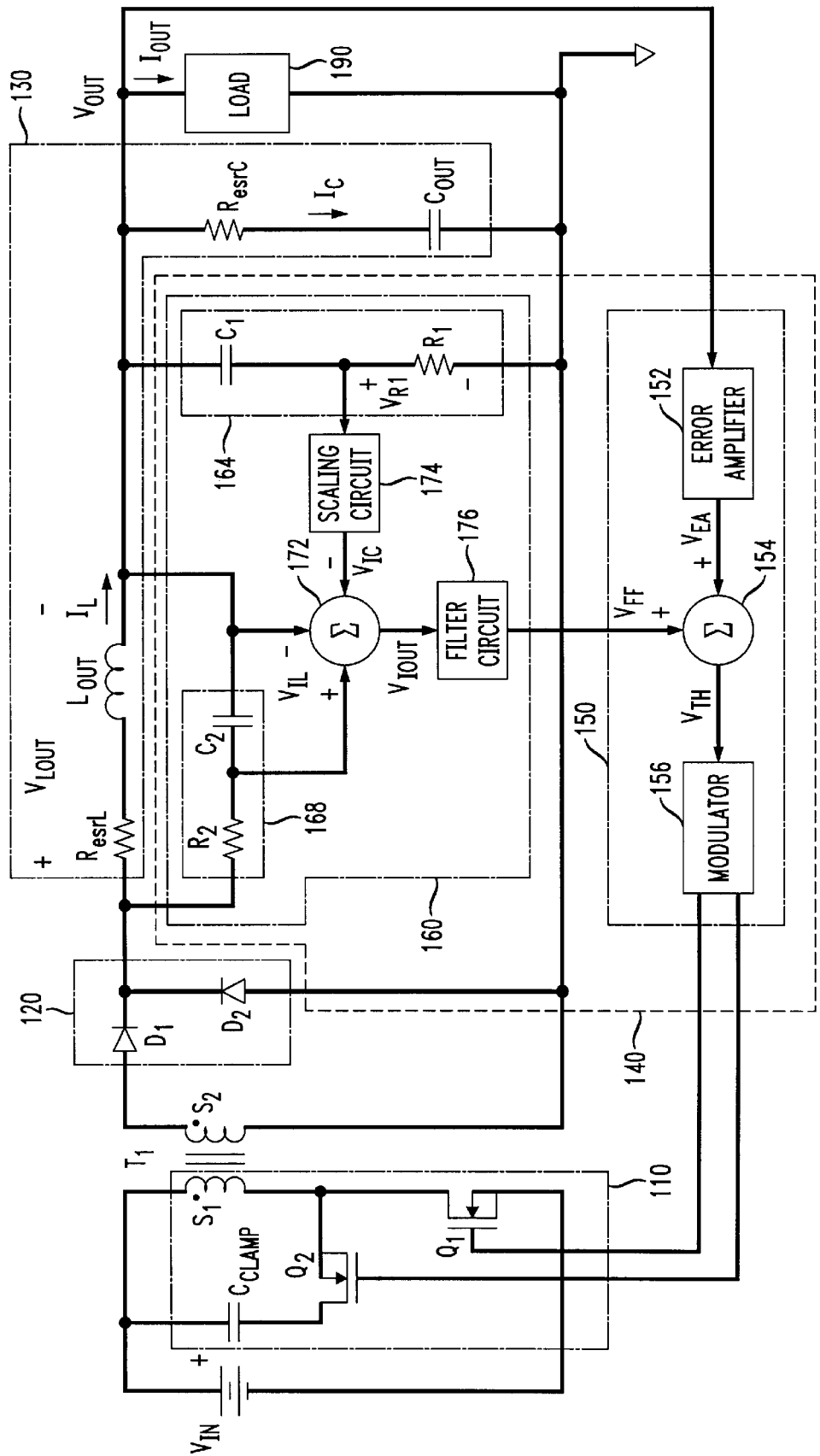
FIG. 1 illustrates a schematic diagram of an embodiment of a power converter constructed in accordance with the principles of the present invention.

Turning now to FIG. 1, illustrated is a schematic diagram of an embodiment of a power converter 100 constructed in accordance with the principles of the present invention. The power converter 100 includes an inverter (power switching circuit) 110 coupled to an input of the power converter 100. The power converter 100 further includes a transformer $T_1$ having a primary winding $S_1$ coupled to the inverter 110 and a secondary winding $S_2$. The power converter 100 further includes a rectifier 120, coupled to the secondary winding $S_2$, that rectifies a periodic waveform supplied by the secondary winding $S_2$. The power converter 100 further includes an output filter 130 coupled to the rectifier 120. The output filter 130 filters the rectified waveform from the rectifier 120 to supply an output voltage $V_{OUT}$ to a load 190 at an output of the power converter 100. The power converter 100 still further includes a control circuit 140, coupled to the inverter 110, that monitors the output voltage $V_{OUT}$ and adjusts the switching cycle of inverter 110 to regulate the output voltage $V_{OUT}$. While the illustrated embodiment includes a transformer $T_1$, those skilled in the pertinent art will realize that the transformer $T_1$ is not necessary to the present invention and that the principles of the present invention are applicable to isolated and non-isolated power converter topologies.

The inverter 110 includes a power switch $Q_1$ coupled to the input of the power converter 100. The control circuit 140 intermittently switches the power switch $Q_1$ to impress a DC input voltage $V_{IN}$ across the primary winding $S_1$. In the illustrated embodiment, the inverter 110 includes a clamping circuit (having a clamping switch $Q_2$ and a clamping capacitor $C_{CLAMP}$) to reset the flux in the transformer $T_1$ during the off period of the power switch $Q_1$. While the embodiment illustrated and described shows a generic inverter 110, those skilled in the art will realize that the principles of the present invention may be employed with a wide variety of inverter topologies.

The rectifier 120 includes first and second rectifier diodes $D_1$, $D_2$ arranged in a forward topology. Those skilled in the art are familiar with forward rectifier circuits. Of course, other rectifier topologies, including those employing synchronous rectifiers, are well within the broad scope of the present invention.

The output filter 130 includes an output capacitor $C_{OUT}$, having an equivalent series resistance $R_{esrC}$, coupled across the output of the power converter 100. The output filter 130 further includes a component coupled to the output capacitor $C_{OUT}$. In the illustrated embodiment, the component is an output inductor $L_{OUT}$ having an equivalent series resistance $R_{esrL}$. Those skilled in the art realize that the equivalent series resistances $R_{esrC}$, $R_{esrL}$ are intrinsic to the output capacitor $C_{OUT}$ and the output inductor $L_{OUT}$, respectively.

In the illustrated embodiment, the control circuit 140 includes a feedback circuit 150. The feedback circuit 150 monitors the output voltage $V_{OUT}$ and adjusts the switching cycle of the inverter 110 to maintain the output voltage $V_{OUT}$ at a substantially constant level.

The feedback circuit 150 includes an error amplifier 152 coupled to the output of the power converter 100. The error amplifier 152 monitors the output voltage $V_{OUT}$ and produces therefrom an error amplifier voltage $V_{EA}$ representing a difference between the output voltage $V_{OUT}$ and a reference voltage. Those skilled in the art will recognize that the reference voltage may include a signal representing an output current $I_{OUT}$ or another parameter in the power converter 100. The feedback circuit 150 further includes a feedback summer circuit 154 coupled to the error amplifier 152 and a feedforward circuit 160. The feedback summer circuit 154 develops a threshold voltage $V_{TH}$ that is a sum of the error amplifier voltage $V_{EA}$ and a feedforward signal $V_{FF}$ from the feedforward circuit 160. The feedback circuit 150 still further includes a modulator 156 coupled to the feedback summer circuit 154. The modulator 156 compares the threshold voltage $V_{TH}$ to a periodic ramp signal and develops therefrom a switching waveform that drives the power switch $Q_1$.

The feedback circuit 150, however, may not be able to adequately regulate the output voltage $V_{OUT}$ when the power converter 100 is employed to power loads requiring wide bandwidth step changes in the output current. The control circuit 140, therefore, further includes the feedforward circuit 160 that estimates a time-varying output current $I_{OUT}$ to the load 190.

The feedforward circuit 160 includes an observer circuit 164 parallel-coupled to the output capacitor $C_{OUT}$ (and its equivalent series resistance $R_{esrC}$). The observer circuit 164 is designed to indirectly measure a capacitor current $I_C$ through the output capacitor $C_{OUT}$. In the illustrated embodiment, the observer circuit 164 includes a series-coupled capacitor C, and resistor $R_1$. A capacitor signal $V_{IC}$ representing the capacitor current $I_C$ may, therefore, be determined by measuring a resistor voltage $V_{R1}$ across the resistor $R_1$. While the illustrated observer circuit 164 employs a series-coupled capacitor and resistor, those skilled in the art realize that other observer circuits 164 are well within the broad scope of the present invention.

The feedforward circuit 160 further includes a sensor circuit 168 coupled to the output inductor $L_{OUT}$. In the illustrated embodiment, the sensor circuit 168 is an observer circuit that indirectly measures an inductor current $I_L$ through the output inductor $L_{OUT}$. Of course, the sensor circuit 168 need not be an observer circuit.

The sensor circuit 168 includes a series-coupled capacitor $C_2$ and resistor $R_2$. The sensor circuit 168 senses an inductor voltage $V_{LOUT}$ across the output inductor $L_{OUT}$ and develops therefrom an inductor signal $V_{IL}$ (component signal) representing the inductor current $I_L$ through the output inductor $L_{OUT}$. While the illustrated sensor circuit 168 employs a series-coupled capacitor $C_2$ and resistor $R_2$, those skilled in the art realize that other sensor circuits 168 are well within the broad scope of the present invention.

The feedforward circuit 160 further includes a feedforward summer circuit 172 coupled to the observer circuit 164 and the sensor circuit 168. In the illustrated embodiment, the feedforward circuit 160 further includes a scaling circuit 174 coupled between the observer circuit 164 and the feedforward summer circuit 172. The scaling circuit 174 adjusts a gain of the capacitor signal $V_{IC}$ relative to the inductor signal $V_{IL}$. In an alternative embodiment, the scaling circuit 174 may be coupled between the sensor circuit 168 and the feedforward summer circuit 172 to adjust a gain of the inductor signal $V_{IL}$ relative to capacitor signal $V_{IC}$. Of course, the scaling circuit 174 is not required to practice the present invention. The scaling circuit 174 advantageously adjusts a scaling factor measured in amperes/volt of the capacitor signal $V_{IC}$ or the inductor signal $V_{IL}$ to enable the feedforward summer circuit 172 to derive an output signal $V_{IOUT}$ representing the output current $I_{OUT}$ of the power converter 100. Those skilled in the art are familiar with scaling circuits.

The feedforward circuit 160 still further includes a filter circuit 176 coupled to the feedforward summer circuit 172. The filter circuit 176 receives the output signal $V_{IOUT}$ from the feedforward summer circuit 172 and develops therefrom the feedforward signal $V_{FF}$. In the illustrated embodiment, the filter circuit 176 frequency shapes the output signal $V_{IOUT}$ to produce the feedforward signal $V_{FF}$. Additionally, the filter circuit 176 may adjust a gain of the output signal $V_{IOUT}$ as required to allow the feedback circuit 150 to properly employ the feedforward signal $V_{FF}$. Those skilled in the art are familiar with the frequency shaping capability of filter circuits.

Figure 2:
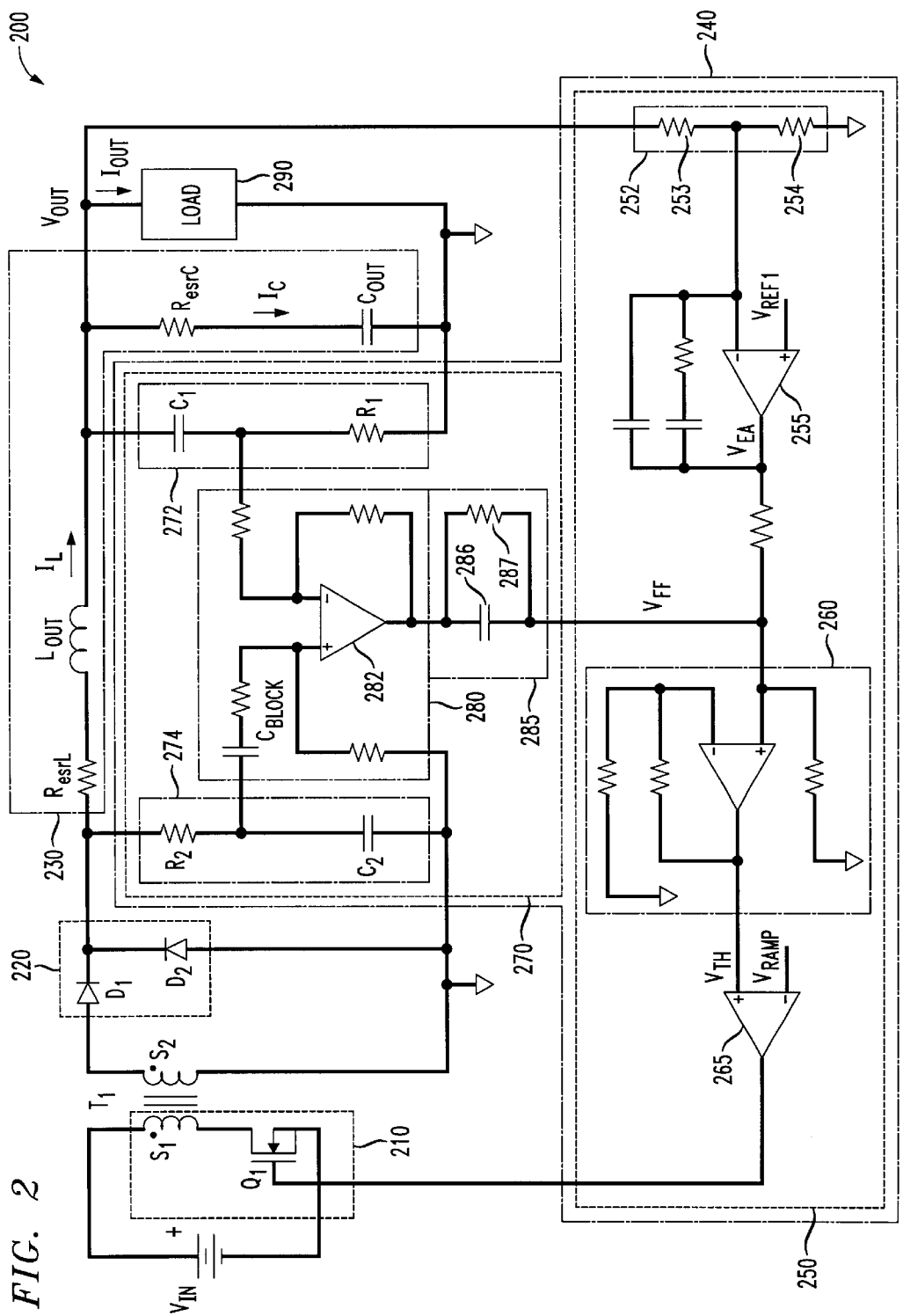
FIG. 2 illustrates a schematic diagram of another embodiment of a power converter constructed in accordance with the principles of the present invention.

Turning now to FIG. 2, illustrated is a schematic diagram of another embodiment of a power converter 200 constructed in accordance with the principles of the present invention. The power converter 200 includes an inverter 210, having a power switch $Q_1$, coupled to an input of the power converter 200. While the inverter 210 is illustrated as a generic inverter, those skilled in the art will realize that the principles of the present invention may be employed with a wide variety of inverter topologies.

The power converter 200 further includes a transformer $T_1$ having primary winding $S_1$ coupled to the inverter 210 and a secondary winding $S_2$. The power converter 200 further includes a rectifier 220, coupled to the secondary winding $S_2$, that rectifies a periodic waveform supplied by the secondary winding $S_2$. While the power converter 200 employs a forward rectifier 220, other rectifier topologies are well within the broad scope of the present invention.

The power converter 200 further includes an output filter 230, coupled to the rectifier 220, that filters the rectified waveform from the rectifier 220 to supply an output voltage $V_{OUT}$ to a load 290 at an output of the power converter 200. In the illustrated embodiment, the output filter 230 includes an output capacitor $C_{OUT}$, having an equivalent series resistance $R_{esrC}$, coupled across the output of the power converter 200. The output filter 230 further includes an output inductor $L_{OUT}$, having an equivalent series resistance $R_{esrL}$, coupled to the output capacitor $C_{OUT}$. Those skilled in the art realize that the equivalent series resistances $R_{esrC}$, $R_{esrL}$ are intrinsic to the output capacitor $C_{OUT}$ and the output inductor $L_{OUT}$, respectively.

The power converter 200 still further includes a control circuit 240 coupled to the inverter 210. In the illustrated embodiment, the control circuit 240 includes a feedback circuit 250 and a feedforward circuit 270. The feedforward circuit 270 estimates a time-varying output current $I_{OUT}$ to the load 190 and develops therefrom a feedforward signal $V_{FF}$. The feedback circuit 250 monitors the output voltage $V_{OUT}$ and the feedforward signal $V_{FF}$ and adjusts the switching cycle of the inverter 210 to maintain the output voltage $V_{OUT}$ at a substantially constant level.

The feedback circuit 250 includes a voltage scaling circuit 252, an error amplifier 255, a feedback summer circuit 260 and a modulator 265. The voltage scaling circuit 252 is coupled to the output of the power converter 200 and includes first and second voltage scaling resistors 253, 254. The voltage scaling circuit 252 scales the output voltage $V_{OUT}$ to develop a scaled output voltage. The error amplifier 255 is coupled to the voltage scaling circuit 252 and receives the scaled output voltage therefrom. The error amplifier 255 (and its associated compensation network) compares the scaled output voltage to a reference voltage $V_{REF1}$ and develops therefrom an error amplifier voltage $V_{EA}$ representing a scaled difference between a desired output voltage (represented by the reference voltage $V_{REF1}$) and the actual output voltage $V_{OUT}$.

The feedback summer circuit 260 is coupled to the error amplifier 255 and the feedforward circuit 270. The feedback summer circuit 260 receives the error amplifier voltage $V_{EA}$ and the feedforward signal $V_{FF}$ and develops therefrom a threshold signal $V_{TH}$. The modulator 265 is coupled to the feedback summer circuit 260 and receives the threshold signal $V_{TH}$ therefrom. The modulator 265 compares the threshold voltage $V_{TH}$ to a periodic ramp signal $V_{RAMP}$ and develops therefrom a switching waveform that drives the power switch $Q_1$.

The feedforward circuit 270 includes an observer circuit 272, a sensor circuit 274, a feedforward summer circuit 280 and a filter circuit 285. The observer circuit 272 is parallel-coupled to the output capacitor $C_{OUT}$ and its equivalent series resistance $R_{esrC}$ to indirectly measure a capacitor current $I_C$ through the output capacitor $C_{OUT}$. In the illustrated embodiment, the observer circuit 272 includes a series-coupled capacitor $C_1$ and resistor $R_1$. A capacitor signal representing the capacitor current $I_C$ may, therefore, be determined by measuring a resistor voltage across the resistor $R_1$. While the illustrated observer circuit 272 employs a series-coupled capacitor and resistor, those skilled in the art realize that other observer circuits 272 are well within the broad scope of the present invention.

The sensor circuit 274 is coupled to the output inductor $L_{OUT}$ and its equivalent series resistance $R_{esrL}$. In the illustrated embodiment, the sensor circuit 274 is an observer circuit that indirectly measures an inductor current $I_L$ through the output inductor $L_{OUT}$. The sensor circuit 274 includes a series-coupled capacitor $C_2$ and resistor $R_2$. The sensor circuit 274 senses a voltage across the output inductor $L_{OUT}$ and develops therefrom a component signal representing the inductor current $I_L$. While the illustrated sensor circuit 274 employs a series-coupled capacitor $C_2$ and resistor $R_2$, those skilled in the art realize that other sensor circuits 274 are well within the broad scope of the present invention.

The feedforward summer circuit 280 is coupled to the observer circuit 272 and the sensor circuit 274. In the illustrated embodiment, the feedforward summer circuit 280 includes a differential amplifier 282 and its associated circuitry. By selecting the components of the feedforward summer circuit 280, a scaled and weighted difference between the capacitor signal and the component signal may be obtained. The feedforward summer circuit 280 may thus derive an output signal representing the estimated output current $I_{OUT}$ of the power converter 100. In the illustrated embodiment, the feedforward summer circuit 280 further includes a blocking capacitor $C_{BLOCK}$ coupled between the sensor circuit 274 and the differential amplifier 282. The blocking capacitor $C_{BLOCK}$ blocks a DC component of the output voltage $V_{OUT}$ from the differential amplifier 282.

The filter circuit 285 is coupled between the feedforward summer circuit 280 and the feedback summer circuit 260 of the feedback circuit 250. In the illustrated embodiment, the filter circuit 285 includes a capacitor 286 and a resistor 287 parallel-coupled across the capacitor 286. The capacitor 286, in conjunction with a resistive input to the feedback summer circuit 260, develops the feedforward signal $V_{FF}$, which represents a time derivative of the estimated output current $I_{OUT}$. The resistor 287 adds a feedforward component to the feedback summer circuit 260 to compensate for parasitic resistances in an output path of the power converter 200.

Figure 3A:
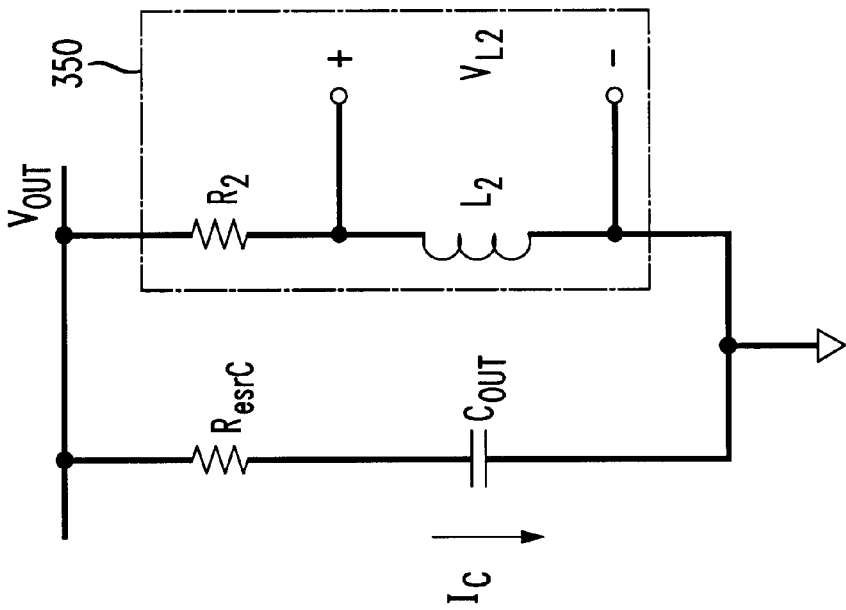
FIGS. 3A and 3B illustrate schematic diagrams of embodiments of an observer circuit for an output capacitor constructed in accordance with the principles of the present invention.
Figure 3B:
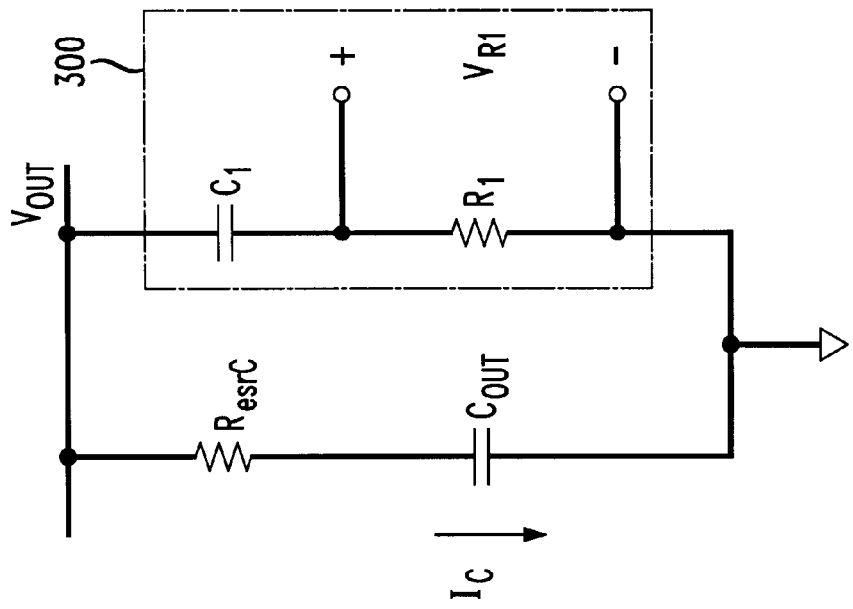

Turning now to FIGS. 3A and 3B, illustrated are schematic diagrams of embodiments of an observer circuit for an output capacitor $C_{OUT}$ constructed in accordance with the principles of the present invention. More specifically, FIG. 3A illustrates a first observer circuit 300. The first observer circuit 300 is parallel-coupled across the output capacitor $C_{OUT}$ (and its equivalent series resistance $R_{esrC}$) and includes a series-coupled capacitor $C_1$ and resistor $R_1$. The first observer circuit 300 is designed to observe a capacitor current $I_C$ through the output capacitor $C_{OUT}$. A resistor voltage $V_{R1}$ across the resistor $R_1$ may be represented by the following equation.

$$V_{R1} = I_C \cdot \frac{R_1 \cdot C_1}{C_{OUT}} \left( \frac{1 + s \cdot R_{esrC} \cdot C_{OUT}}{1 + s \cdot R_1 \cdot C_1} \right)$$

The above equation may be simplified by selecting the capacitor $C_1$ and the resistor $R_1$ such that a time constant thereof is equivalent to a time constant of the output capacitor $C_{OUT}$ and its equivalent series resistance $R_{esrC}$. The capacitor current $I_C$ through the output capacitor $C_{OUT}$ may thus be represented as set forth below.

$$I_C = \left( \frac{V_{R1} \cdot C_{OUT}}{R_1 \cdot C_1} \right)$$

The capacitor current $I_C$ may, therefore, be determined by measuring the resistor voltage $V_{R1}$.

Turning now to FIG. 3B, illustrated is a second observer circuit 350 constructed in accordance with the principles of the present invention. Analogous to the first observer circuit 300, the second observer circuit 350 is also parallel-coupled across the output capacitor $C_{OUT}$ and may be employed to observe the capacitor current $I_C$ through the output capacitor $C_{OUT}$. The second observer circuit 350 includes a series-coupled resistor $R_2$ and inductor $L_2$. The capacitor current $I_C$ is related to an inductor voltage $V_{L2}$ across the inductor $L_2$ by the following equation.

$$I_C = \frac{V_{L2} \cdot C_{OUT} \cdot R_2}{L_2} \left( \frac{s \cdot \frac{L_2}{R_2} + 1}{s \cdot C_{OUT} \cdot R_{esrC} + 1} \right)$$

If the inductor $L_2$ and the resistor $R_2$ are selected such that a time constant thereof is equivalent to a time constant of the output capacitor $C_{OUT}$ and its equivalent series resistance $R_{esrC}$, the above equation may be simplified as set forth below.

$$I_C = \frac{V_{L2}}{R_{esrC}}$$

The capacitor current $I_C$ may, therefore, be determined by measuring the inductor voltage $V_{L2}$. Those skilled in the art will realize that the first and second observer circuits 300, 350 are submitted for illustrative purposes only and that other observer circuits capable of indirectly measuring the capacitor current $I_C$ through the output capacitor $C_{OUT}$ are well within the broad scope of the present invention.

Figure 4B:
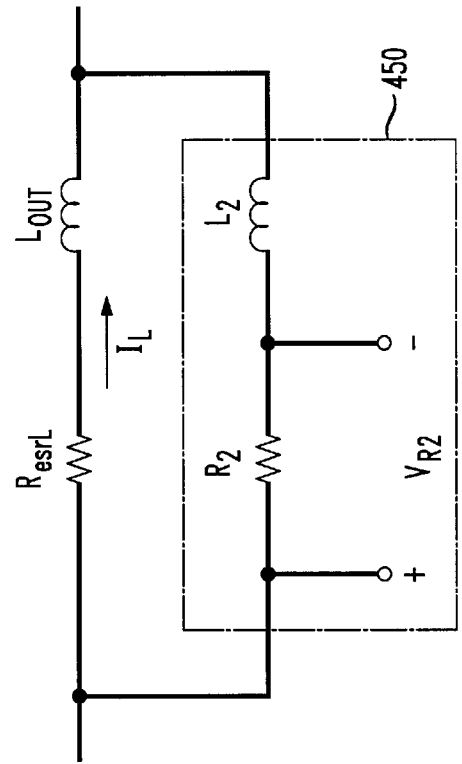
FIGS. 4A and 4B illustrate schematic diagrams of embodiments of a sensor circuit for a component constructed in accordance with the principles of the present invention.
Figure 4A:
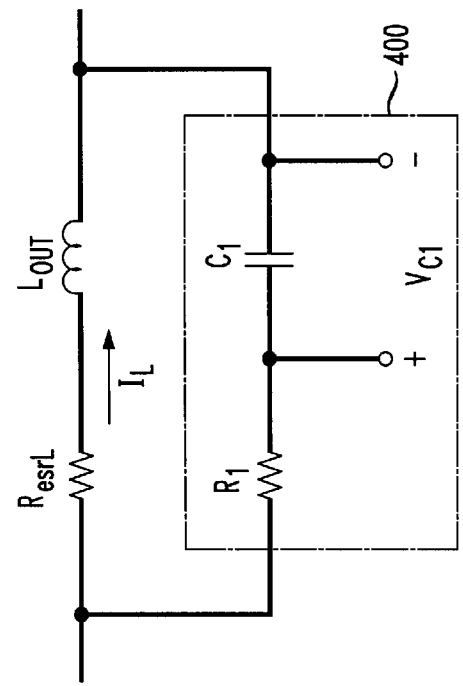

Turning now to FIGS. 4A and 4B, illustrated are schematic diagrams of embodiments of a sensor circuit for a component (e.g., an output inductor $L_{OUT}$) constructed in accordance with the principles of the present invention. More specifically, FIG. 4A illustrates a first sensor circuit 400. In the illustrated embodiment, the first sensor circuit 400 is an observer circuit that indirectly measures an inductor current $I_L$ through the output inductor $L_{OUT}$. The first sensor circuit 400 is parallel-coupled across the output inductor $L_{OUT}$ (and its equivalent series resistance $R_{esrL}$) and includes a series-coupled resistor $R_1$ and capacitor $C_1$. The inductor current $I_L$ develops a capacitor voltage $V_{C1}$ across the capacitor $C_1$. The capacitor voltage $V_{C1}$ may be represented by the following equation.

$$V_{C1} = I_L \cdot R_{esrL} \cdot \left( \frac{1 + \frac{s \cdot L_{OUT}}{R_{esrL}}}{1 + s \cdot R_1 \cdot C_1} \right)$$

The above equation may be simplified by selecting the resistor $R_1$ and the capacitor $C_1$ such that a time constant thereof is equivalent to a time constant of the output inductor $L_{OUT}$ and its equivalent series resistance $R_{esrL}$. The inductor current $I_L$ through the output inductor $L_{OUT}$ may thus be represented as set forth below.

$$I_L = \frac{V_{C1}}{R_{esrL}}$$

The inductor current $I_L$ may, therefore, be determined by measuring the capacitor voltage $V_{C1}$.

Turning now to FIG. 4B, illustrated is a second sensor circuit 450 constructed in accordance with the principles of the present invention. Analogous to the first sensor circuit 400, the second sensor circuit 450 is an observer circuit that indirectly measures the inductor current $I_L$ through the output inductor $L_{OUT}$. The second sensor circuit 450 is parallel-coupled across the output inductor $L_{OUT}$ and includes a series-coupled resistor $R_2$ and inductor $L_2$. The inductor current $I_L$ is related to a resistor voltage $V_{R2}$ across the resistor $R_2$ by the following equation.

$$I_L = \frac{V_{R2}}{R_{esrL}} \cdot \left( \frac{1 + s \cdot \frac{L_2}{R_2}}{1 + s \cdot \frac{L_{OUT}}{R_{esrL}}} \right)$$

If the inductor $L_2$ and the resistor $R_2$ are selected such that a time constant thereof is equivalent to a time constant of the output inductor $L_{OUT}$ and its equivalent series resistance $R_{esrL}$, the above equation may be simplified as set forth below.

$$I_L = \frac{V_{R2}}{R_{esrL}}$$

The inductor current $I_L$ may, therefore, be determined by measuring the resistor voltage $V_{R2}$. Those skilled in the art will realize that the first and second sensor circuits 400, 450 are submitted for illustrative purposes only and that other sensor circuits capable of measuring a characteristic of the component (e.g., the inductor current $I_L$ through the output inductor $L_{OUT}$) are well within the broad scope of the present invention.

Figure 5:
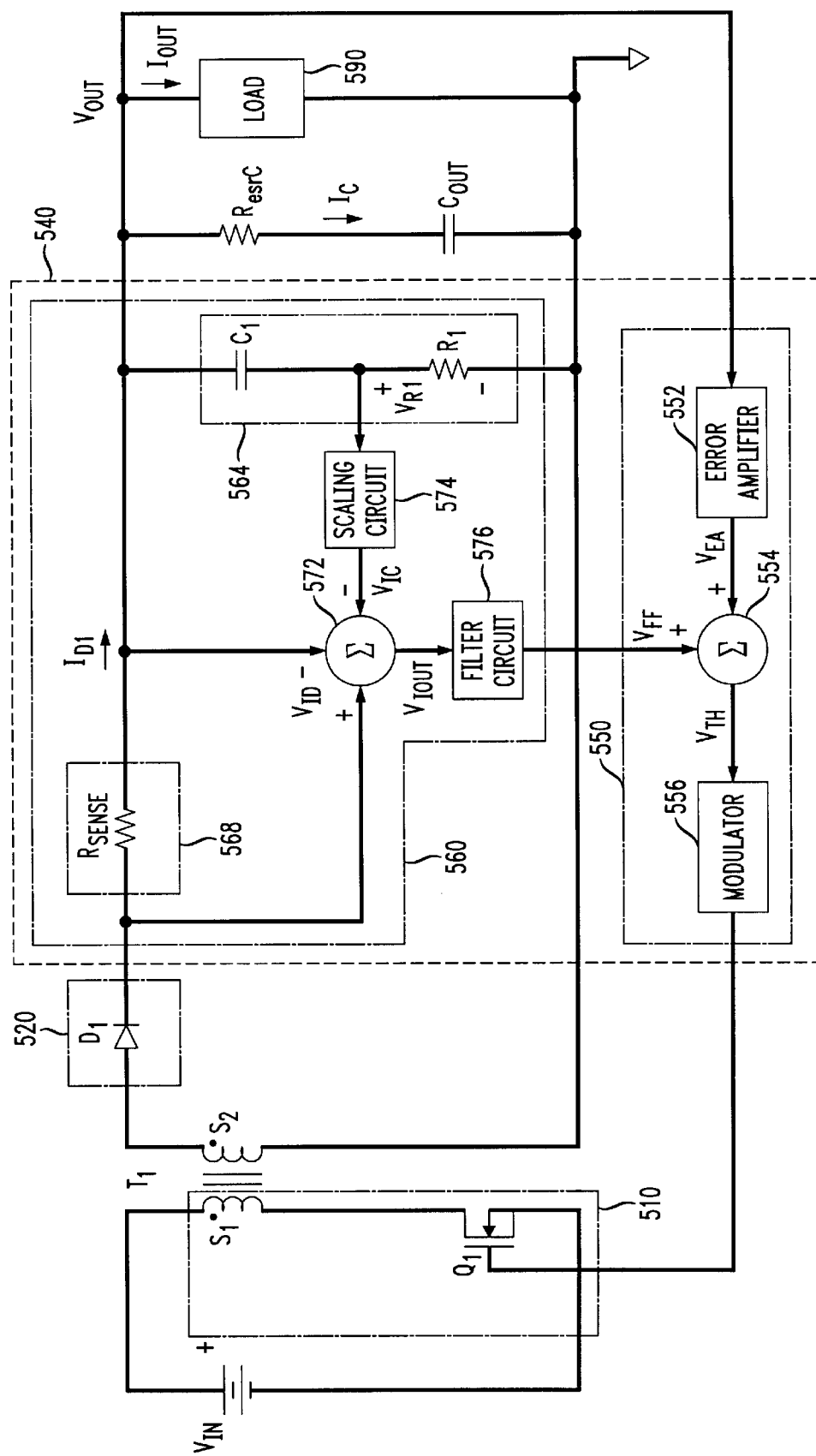
FIG. 5 illustrates a schematic diagram of another embodiment of a power converter constructed in accordance with the principles of the present invention.

Turning now to FIG. 5, illustrated is a schematic diagram of another embodiment of a power converter 500 constructed in accordance with the principles of the present invention. The power converter 500 employs a flyback topology and includes an inverter 510 coupled to an input of the power converter 500. Those skilled in the art arc familiar with a number of inverter topologies that may be employed to advantage with the principles of the present invention. The power converter 500 further includes a transformer $T_1$ having a primary winding $S_1$ coupled to the inverter 510 and a secondary winding $S_2$. The inverter 510 switches intermittently to apply a DC input voltage $V_{IN}$ across the primary winding $S_1$ of the transformer $T_1$. The power converter 500 further includes a rectifier 520 coupled to the secondary winding $S_2$. In the illustrated embodiment, the rectifier 520 includes a flyback diode $D_1$ that rectifies a periodic waveform supplied by the secondary winding $S_2$. Of course, the use of other rectifier circuits are well within the broad scope of the present invention. The power converter 500 further includes an output capacitor $C_{OUT}$ coupled to the flyback diode $D_1$. The output capacitor $C_{OUT}$ filters the rectified waveform from the rectifier 520 to supply an output voltage $V_{OUT}$ to a load 590 at an output of the power converter 500. In the illustrated embodiment, the equivalent series resistance $R_{esrC}$ of the output capacitor $C_{OUT}$ is explicitly illustrated. Those skilled in the art realize, of course, that the equivalent series resistance $R_{esrC}$ is intrinsic to the output capacitor $C_{OUT}$. The power converter 500 still further includes a control circuit 540 coupled to the inverter 510.

In the illustrated embodiment, the control circuit 540 includes a feedback circuit 550 that monitors the output voltage $V_{OUT}$ and adjusts the switching cycle of inverter 510 to regulate the output voltage $V_{OUT}$. The control circuit 540 further includes a feedforward circuit 560 that estimates a time-varying output current $I_{OUT}$ to the load 590.

The feedback circuit 550 includes an error amplifier 552 coupled to the output of the power converter 500. The error amplifier 552 monitors the output voltage $V_{OUT}$ and produces therefrom an error amplifier voltage $V_{EA}$ representing a difference between the output voltage $V_{OUT}$ and a reference voltage. Those skilled in the art will recognize that the reference voltage may include a signal representing the output current $I_{OUT}$ or another parameter in the power converter 500. The feedback circuit 550 further includes a feedback summer circuit 554 coupled to the error amplifier 552 and the feedforward circuit 560. The feedback summer circuit 554 develops a threshold voltage $V_{TH}$ that is a sum of the error amplifier voltage $V_{EA}$ and a feedforward signal $V_{FF}$ from the feedforward circuit 560. The feedback circuit 550 still further includes a modulator 556 coupled to the feedback summer circuit 554. The modulator 556 compares the threshold voltage $V_{TH}$ to a periodic ramp signal and develops therefrom a switching waveform that drives the power switch $Q_1$. Those skilled in the art understand, of course, that the above described feedback circuit 550 is submitted for illustrative purposes only and that other feedback circuits are well within the broad scope of the present invention.

The feedforward circuit 560 includes an observer circuit 564, parallel-coupled to the output capacitor $C_{OUT}$ (and its equivalent series resistance $R_{esrC}$) that indirectly measures a capacitor current $I_C$ through the output capacitor $C_{OUT}$. In the illustrated embodiment, the observer circuit 564 includes a series-coupled capacitor $C_1$ and resistor $R_1$. A capacitor signal $V_{IC}$ representing the capacitor current $I_C$ may, therefore, be developed by measuring a resistor voltage $V_{R1}$ across the resistor $R_1$. While the illustrated observer circuit 564 employs a series-coupled capacitor and resistor, those skilled in the art realize that other observer circuits are well within the broad scope of the present invention.

The feedforward circuit 560 further includes a sensor circuit 568 series-coupled to the flyback diode $D_1$. In the illustrated embodiment, the sensor circuit 568 includes a sense resistor $R_{SENSE}$. In an alternative embodiment, the sensor circuit 568 may include other elements, such as a current-sensing transformer. In either case, the sensor circuit 568 directly measures the voltage across the sense resistor $R_{SENSE}$ and develops a flyback signal $V_{ID}$ (component signal) representing the current through the flyback diode $D_1$.

The feedforward circuit 560 further includes a feedforward summer circuit 572 coupled to the observer circuit 564 and the sensor circuit 568. In the illustrated embodiment, the feedforward circuit 560 further includes a scaling circuit 574 coupled between the observer circuit 564 and the feedforward summer circuit 572. The scaling circuit 560 adjusts a gain of the capacitor signal $V_{IC}$ relative to the flyback signal $V_{ID}$. In an alternative embodiment, the scaling circuit 574 may be coupled between the sensor circuit 568 and the feedforward summer circuit 572 to adjust a gain of the flyback signal $V_{ID}$ relative to capacitor signal $V_{IC}$. Of course, the scaling circuit 574 is not required to practice the present invention. The scaling circuit 574 advantageously adjusts a scaling factor measured in amperes/volt of the capacitor signal $V_{IC}$ or the flyback signal $V_{ID}$ to enable the feedforward summer circuit 572 to derive an output signal $V_{IOUT}$ representing the output current $I_{OUT}$ of the power converter 500. Those skilled in the art are familiar with scaling circuits.

The feedforward circuit 560 still further includes a filter circuit 576 coupled to the feedforward summer circuit 572. The filter circuit 576 receives the output signal $V_{IOUT}$ from the feedforward summer circuit 572 and develops therefrom the feedforward signal $V_{FF}$. In the illustrated embodiment, the filter circuit 576 frequency shapes the output signal $V_{IOUT}$ to produce the feedforward signal $V_{FF}$. Additionally, the filter circuit 576 may adjust a gain of the output signal $V_{IOUT}$ as required to allow the feedback circuit 550 to properly employ the feedforward signal $V_{FF}$. Those skilled in the art are familiar with the frequency shaping capability of filter circuits.

The observer and sensor circuits 564, 568 thus cooperate to provide the feedforward circuit 560 with a measurement of the output current $I_{OUT}$. The feedforward signal $V_{FF}$ may, therefore, be supplied to the feedback circuit 550 to allow the control circuit 540 to compensate for the fast changes in the output current $I_{OUT}$ required by the load 590.

Figure 6:
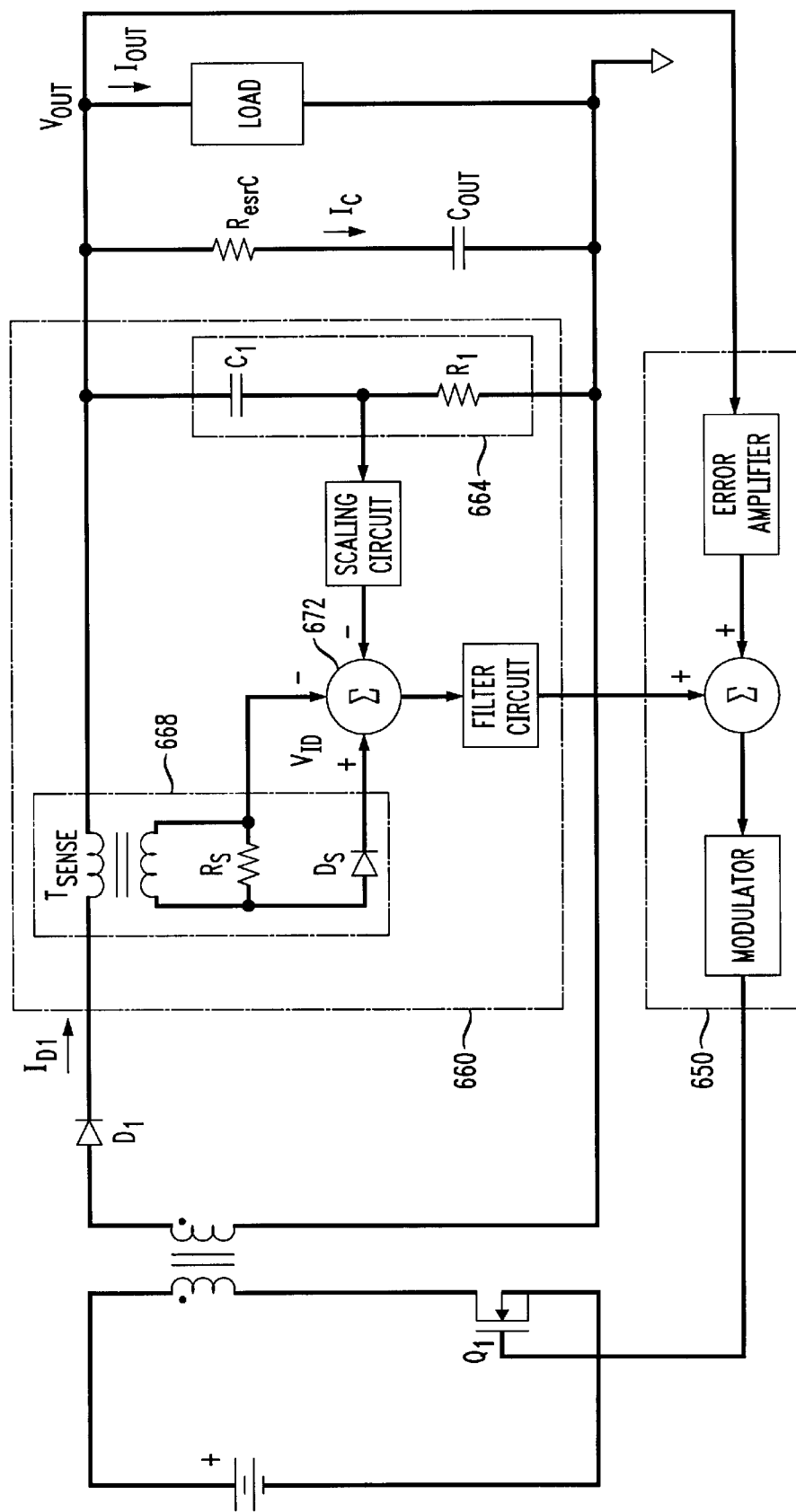
FIG. 6 illustrates a schematic diagram of yet another embodiment of a power converter constructed in accordance with the principles of the present invention.

Turning now to FIG. 6, illustrated is a schematic diagram of yet another embodiment of a power converter 600 constructed in accordance with the principles of the present invention. The power converter 600 is substantially similar to the power converter 500 of FIG. 5 and, as a result, will not be described in detail.

Analogous to the power converter 500 of FIG. 5, the power converter 600 includes a feedforward circuit 660 having an observer circuit 664 and a sensor circuit 668. The observer circuit 664 is parallel-coupled across the output capacitor $C_{OUT}$ while the sensor circuit 668 is series-coupled to the flyback diode $D_1$. In the illustrated embodiment, the sensor circuit 668 includes a current-sensing transformer $T_{SENSE}$. The sensor circuit 668 further includes a resistor $R_S$ coupled across the current-sensing transformer $T_{SENSE}$. The sensor circuit 668 still further includes a diode $D_S$ coupled between a terminal of the current-sensing transformer $T_{SENSE}$ and the feedforward summer circuit 672. The sensor circuit 668 develops a voltage signal $V_{ID}$ (component signal) across the resistor $R_S$ that is proportional to the current $I_{D1}$ through the flyback diode $D_1$. Those skilled in the art are familiar with current-sensing transformers and their operation. Of course, the use of other components may be coupled in series with the flyback diode $D_1$ and be well within the broad scope of the present invention.

Those skilled in the art should understand that the previously described embodiments of the system and method for indirectly determining an output current of a power converter are submitted for illustrative purposes only and other embodiments capable of providing indirect measurement of the output current are well within the broad scope of the present invention. Additionally, exemplary embodiments of the present invention have been illustrated with reference to specific electronic components. Those skilled in the art are aware, however, that components may be substituted (not necessarily with components of the same type) to create desired conditions or accomplish desired results. For instance, multiple components may be substituted for a single component and vice-versa. The principles of the present invention may be applied to a wide variety of power circuit topologies, including circuit topologies not employing an active clamp. Additionally, the principles of the present invention may be applied to various other converter topologies such as half bridge, full bridge, flyback, and boost converter topologies employing discrete or integrated magnetics. For a better understanding of a variety of power converter topologies employing discrete and integrated magnetic techniques, see *Modern DC-to-DC Switchmode Power Converter Circuits*, by Rudolph P. Severns and Gordon Bloom, Van Nostrand Reinhold Company, New York, N.Y. (1985) and *Principles of Solid-State Power conversion*, by Ralph E. Tarter, Howard W. Sam & Co., Inc., Indianapolis, Ind. (1985), which are incorporated herein by reference in their entirety.

Although the present invention has been described in detail, those skilled in the art should understand that they can make various changes, substitutions and alterations herein without departing from the spirit and scope of the invention in its broadest form.

What is claimed is:

1. For use with a power converter having an output capacitor and a component coupled thereto, a system for determining an output current of said power converter, comprising:

an observer circuit, including one of a series-coupled capacitor and resistor, and a series-coupled resistor and inductor, parallel-coupled to said output capacitor that develops a capacitor signal representing a current through said output capacitor from a voltage observed across one of said resistor of said series-coupled capacitor and resistor, and said inductor of said series-coupled resistor and inductor;

a sensor circuit, coupled to said component, that senses a characteristic of said component and develops therefrom a component signal representing a current through said component; and a summer circuit, coupled to said observer and sensor circuits, that derives an output signal representing said output current from said capacitor signal and said component signal.

2. The system as recited in claim 1 wherein said component is an inductor.

3. The system as recited in claim 1 wherein said component is a diode.

4. The system as recited in claim 1 wherein said sensor circuit is coupled across said component.

5. The system as recited in claim 1 wherein said sensor circuit is selected from the group consisting of:

a series-coupled capacitor and resistor; and a series-coupled resistor and inductor.

6. The system as recited in claim 1 wherein said sensor circuit is series-coupled to said component, said sensor circuit comprising an element selected from the group consisting of:

a resistor; and a current-sensing transformer.

7. The system as recited in claim 1 further comprising a scaling circuit that adjusts a gain of said capacitor signal relative to said component signal.

8. The system as recited in claim 1 further comprising a filter circuit that limits a bandwidth of said output signal.

9. For use with a power converter having an output capacitor and a component coupled thereto, a method of determining an output current of said power converter, comprising:

developing a capacitor signal representing a current through said output capacitor from a voltage observed across one of a resistor of an observer circuit having a capacitor series-coupled to said resistor and an inductor of an observer circuit having a resistor series-coupled to said inductor;

sensing a characteristic of said component and developing therefrom a component signal representing a current through said component; and deriving an output signal representing said output current from said capacitor signal and said component signal.

10. The method as recited in claim 9 wherein said component is an inductor.

11. The method as recited in claim 9 wherein said component is a diode.

12. The method as recited in claim 9 wherein said sensing said characteristic is performed by a sensor circuit coupled across said component.

13. The method as recited in claim 9 wherein said sensing said characteristic is performed by a sensor circuit selected from the group consisting of:
   a series-coupled capacitor and resistor; and
   a series-coupled resistor and inductor.

14. The method as recited in claim 9 wherein said sensing said characteristic is performed by a sensor circuit series-coupled to said component, said sensor circuit comprising an element selected from the group consisting of:
   a resistor; and
   a current-sensing transformer.

15. The method as recited in claim 9 further comprising adjusting a gain of said capacitor signal relative to said component signal.

16. The method as recited in claim 9 further comprising limiting a bandwidth of said output signal.

17. A power converter, comprising:
   a power switching circuit;
   a rectifier, coupled to said power switching circuit;
   an output filter coupled between said rectifier and an output of said power converter and having an output capacitor and a component coupled thereto; and
   a system for determining an output current of said power converter, including:
      an observer circuit, including one of a series-coupled capacitor and resistor, and a series-coupled resistor and inductor, parallel-coupled to said output capacitor that develops a capacitor signal representing a current through said output capacitor from a voltage observed across one of said resistor of said series-coupled capacitor and resistor, and said inductor of said series-coupled resistor and inductor;
      a sensor circuit, coupled to said component, that senses a characteristic of said component and develops therefrom a component signal representing a current through said component; and
      a summer circuit, coupled to said observer and sensor circuits, that derives an output signal representing said output current from said capacitor signal and said component signal.

18. The power converter as recited in claim 17 wherein said component is an inductor.

19. The power converter as recited in claim 17 wherein said component is a diode.

20. The power converter as recited in claim 17 wherein said sensor circuit is coupled across said component.

21. The power converter as recited in claim 17 wherein said sensor circuit is selected from the group consisting of:
   a series-coupled capacitor and resistor; and
   a series-coupled resistor and inductor.

22. The power converter as recited in claim 17 wherein said sensor circuit is series-coupled to said component, said sensor circuit comprising an element selected from the group consisting of:
   a resistor; and
   a current-sensing transformer.

23. The power converter as recited in claim 17 wherein said system further comprises a scaling circuit that adjusts a gain of said capacitor signal relative to said component signal.

24. The power converter as recited in claim 17 wherein said system further comprises a filter circuit that limits a bandwidth of said output signal.

25. The power converter as recited in claim 17 further comprising a transformer having a primary winding coupled to said power switching circuit and a secondary winding coupled to said rectifier.

* * * * *